United States Patent [19]
Bindra et al.

[11] Patent Number: 5,185,073
[45] Date of Patent: Feb. 9, 1993

[54] METHOD OF FABRICATING NENDRITIC MATERIALS

[75] Inventors: Perminder S. Bindra, South Salem; Jerome J. Cuomo, Lincolndale; Thomas P. Gall, Endwell; Anthony P. Ingraham, Endicott; Sung K. Kang; Jungihl Kim, both of Chappaqua; Paul Lauro, Pomona, all of N.Y.; David N. Light, Friendsville, Pa.; Voya R. Markovich, Endwell, N.Y.; Ekkehard F. Miersch, Schoenaich, Fed. Rep. of Germany; Jaynal A. Molla; Douglas O. Powell, both of Endicott, N.Y.; John J. Ritsko, Mount Kisco, N.Y.; George J. Saxenmeyer, Jr., Apalachin, N.Y.; Jack A. Varcoe, Endwell, N.Y.; George F. Walker, New York, N.Y.

[73] Assignee: International Business Machines Corporation, Armonk, N.Y.

[21] Appl. No.: 692,606

[22] Filed: Apr. 29, 1991

Related U.S. Application Data

[60] Division of Ser. No. 606,007, Oct. 30, 1990, Pat. No. 5,137,461, which is a continuation-in-part of Ser. No. 415,435, Sep. 28, 1989, abandoned, which is a continuation of Ser. No. 209,667, Jun. 21, 1988, abandoned.

[51] Int. Cl.$^5$ .............................................. C25D 5/18
[52] U.S. Cl. .................................... 205/104; 205/111; 205/170; 205/265
[58] Field of Search ................. 204/14.1, 47; 205/104, 205/111, 170, 265

[56] References Cited

U.S. PATENT DOCUMENTS

| | | | |
|---|---|---|---|
| 1,155,427 | 10/1915 | Liebmann et al. | 428/665 |
| 2,461,980 | 2/1949 | Hansen | 173/328 |
| 2,576,528 | 11/1951 | Matthysse | 174/94 |
| 3,157,735 | 11/1964 | Stroup et al. | 174/94 |
| 3,239,597 | 3/1966 | Flynn | 174/68.5 |
| 3,254,189 | 5/1966 | Evanicsko Jr. et al. | 200/166 |
| 3,344,316 | 9/1967 | Stelmak | 317/101 |
| 3,526,867 | 9/1970 | Keeler II | 339/17 |
| 3,634,807 | 1/1972 | Grobe et al. | 339/17 |
| 3,714,384 | 1/1973 | Burkhardt et al. | 200/51 R |
| 3,725,844 | 4/1973 | McKeown et al. | 339/49 |

(List continued on next page.)

FOREIGN PATENT DOCUMENTS

| | | |
|---|---|---|
| 20020 | 12/1980 | European Pat. Off. . |
| 0054695 | 12/1980 | European Pat. Off. . |
| 0157916 | 1/1905 | Fed. Rep. of Germany . |

(List continued on next page.)

OTHER PUBLICATIONS

John A. Mock, "On-Off Plating Puts Down Dense, Fine-Grained Finishes", *ME*, Sep. 1978, pp. 76–78.

C. J. Raub et al., Pulse-Plated Gold, *Plating and Surface Finishing*, Sep. 1978, pp. 32–34.

(List continued on next page.)

*Primary Examiner*—John Niebling
*Assistant Examiner*—William T. Leader
*Attorney, Agent, or Firm*—Daniel P. Morris; Alvin J. Riddles

[57] ABSTRACT

A separable and reconnectable connection for electrical equipment is provided that is suitable for miniaturization in which vertical interdigitating members integrally attached and protruding from a planar portion are accommodated in control of damage in lateral displacement that occurs on mating with an opposite similar contact. Displacement damage is averted through accommodating lateral stresses by providing one or more of a conformal opposing contact, by strengthening through coating and base reinforcement and a deformable coating. The contacts are fabricated by physical and chemical processes including sputtering, normal and pulse electroplating and chemical vapor deposition. Pulse electroplating of palladium provides a dendritic deposit of uniform height, uniform rounded points and less branching. The contacts on completion are provided with a surrounding immobilizing material that enhances rigidity.

4 Claims, 7 Drawing Sheets

U.S. PATENT DOCUMENTS

| | | | |
|---|---|---|---|
| 3,725,845 | 4/1973 | Moulin | 339/49 |
| 3,731,258 | 5/1973 | Spicer | 339/48 |
| 3,818,415 | 6/1974 | Evans et al. | 339/17 F |
| 3,881,799 | 5/1975 | Elliott et al. | 339/252 R |
| 4,005,472 | 1/1977 | Harris et al. | 357/71 |
| 4,005,698 | 2/1977 | Cuomo et al. | 126/270 |
| 4,050,756 | 9/1977 | Moore | 339/59 |
| 4,157,932 | 6/1979 | Hirata | 156/310 |
| 4,239,046 | 12/1980 | Ong | 128/640 |
| 4,240,198 | 12/1980 | Alonso | 29/876 |
| 4,254,431 | 3/1981 | Babuka et al. | 357/82 |
| 4,328,410 | 5/1982 | Slivinsky et al. | 219/121 |
| 4,433,887 | 2/1984 | Sado et al. | 339/17 R |
| 4,448,487 | 5/1984 | Cuomo et al. | 350/164 |
| 4,449,774 | 5/1984 | Takashi et al. | 339/59 |
| 4,451,714 | 5/1984 | Eventhoff | 200/5 |
| 4,468,293 | 8/1984 | Polan et al. | 204/27 |
| 4,600,600 | 7/1986 | Pammer et al. | 427/89 |
| 4,604,644 | 8/1986 | Beckham et al. | 357/80 |
| 4,616,401 | 10/1986 | Takeuchi | 29/571 |
| 4,644,130 | 2/1987 | Bachmann | 219/121 |
| 4,645,734 | 2/1987 | Takada et al. | 430/315 |
| 4,661,192 | 4/1987 | McShane | 156/292 |
| 4,751,563 | 6/1988 | Laibowitz et al. | 357/71 |
| 4,770,641 | 9/1988 | Rowlette | 439/86 |

FOREIGN PATENT DOCUMENTS

| | | |
|---|---|---|
| 2151683 | 4/1973 | Fed. Rep. of Germany . |
| 2816328 | 10/1978 | Fed. Rep. of Germany . |
| 81237661 | 5/1988 | Fed. Rep. of Germany . |
| 1170621 | 1/1959 | France . |
| 52-73394 | 6/1977 | Japan . |
| 62-240739 | 4/1988 | Japan . |

OTHER PUBLICATIONS

Richard Haynes, Quantity of Metal Deposited in Pulsed Plating vs. Direct Current Plating, *Journal of the Electrochemical Society*, May 1979.

F. A. Lowenheim, *Modern Electroplating*, John Wiley & Sons, Inc. New York, 1979, pp. 224–233.

IBM Technical Disclosure Bulletin vol. 14, No. 9, Feb. 1972, p. 2769 "Dendritic Wick for Heat Pipe Application" Ingram et al.

IBM Technical Disclosure Bulletin vol. 18, No. 4 Sep. 1975 pp. 1239–1240 "Low to High–Temperature Capillary", J. J. Cuomo.

IBM Technical Disclosure Bulletin vol. 19, No. 5, Oct. 1976 p. 1922 "Converting Anisotropic Photon Absorbers into Isotropic Absorbers", J. J. Cuomo.

IBM Technical Disclosure Bulletin vol. 20, No. 118, Apr. 1978 p. 4789 "Liquid Metal Multihead Connector", V. Y. Doo.

IBM Technical Disclosure Bulletin vol. 22, No. 7, Dec. 1979 p. 2706 "Liquid Metal/Dendrite Connector" Babuka et al.

IBM Technical Disclosure Bulletin vol. 23, No. 8, Jan. 1981 p. 3631 "Dendrite Connector System with Reinforced Base", E. J. Armstrong.

IBM Technical Disclosure Bulletin, vol 24 No. 1A Jun. 1981 p. 2 "Process for Producing Palladium Structures" E. J. Armstrong et al.

Electrical Manufacturing Nov. 1954 pp. 110 to 114 "A Hidden Cause of Failure in Electronic Equipment: Metal Whiskers", S. M. Arnold.

Wiley & Sons 1976 pp. 136–139, 144 "The Structure and Properties of Materials", Moffatt et al.

Scientific American, Jul. 1960 pp. 64–72 "Whiskers", S. S. Brenner.

Encyclopaedic Dictionary of Physics, Pergamon Press, 1961 pp. 286–287 Thewlis et al.

American Electroplaters Society-Solar Collectors Symposium, Atlanta, Ga. Nov. 9–10, 1976 "Dendritic Tungsten for Solar Thermal Conversion", Cuomo et al.

IBM Journal of Research and Development vol. No. 4 Jul. 1978 pp. 372–377 "Solar Absorbing Surfaces of Anodized Dendritic Tungsten", Pettit et al.

Journal of Electrochemical Society vol. 116 No. 12 pp. 1742–1745 Dec. 1969 "Electrical Resistivity of Tungsten Films Prepared by $WF_6$ Reduction", Mayadas et al.

Electronic Design Sep. 13, 1965 pp. 34–37 "Switch Needs Dictate Contact Material", M. Grundfest.

IBM Technical Report TR01A230 Jun. 11, 1987 "Encapsulating C-4 Joints on Metallized Ceramics", J. G. Ameen et al.

ASM World Materials Congress Sep. 1988 "Controlled Collapse Chip Connections (C4)".

Research Disclosure-vol. 287 No. 48 Mar. 10, 1988 p. 155.

HILLOCK TUNGSTEN

DENDRITIC TUNGSTEN

Dendrite / Pad After Mating

Pd Dendrite

Pb-Sn Eutectic Solder

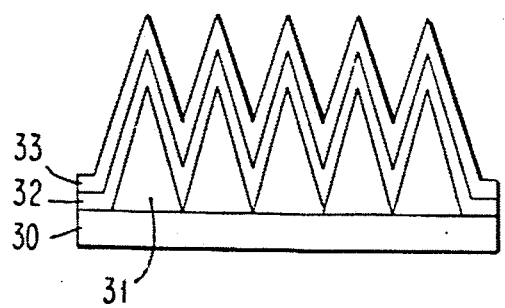
FIG. 11
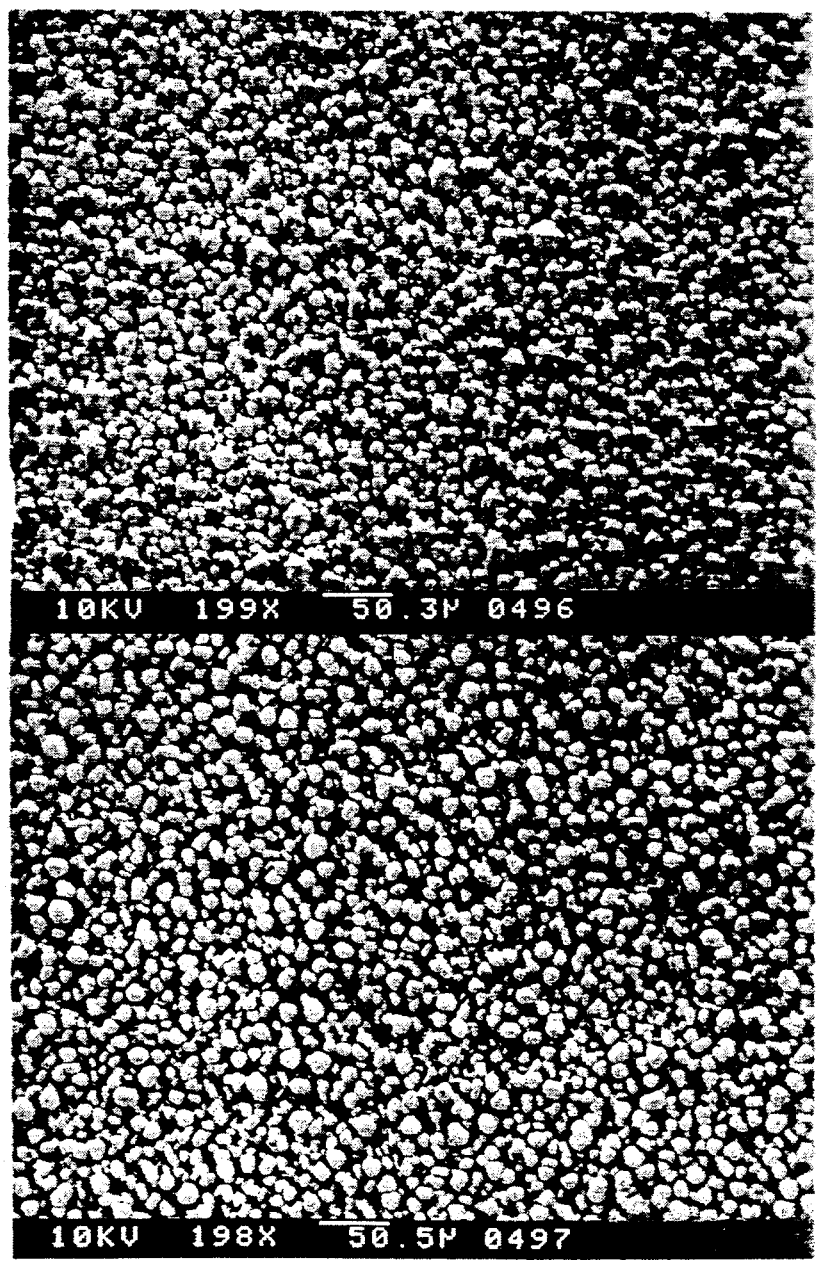
FIG. 12
FIG. 13

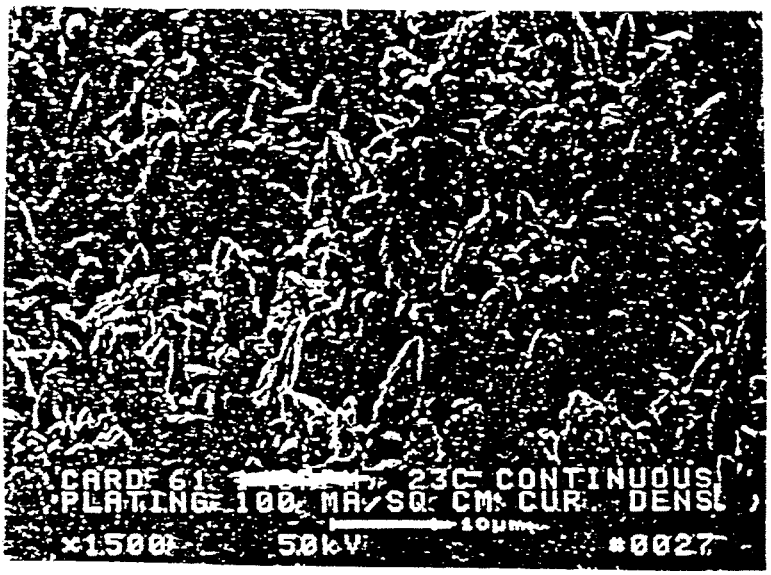
FIG. 18
FIG. 19
FIG. 21
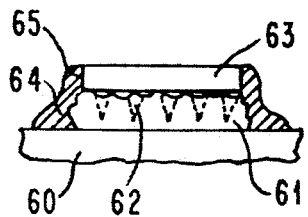
FIG. 20
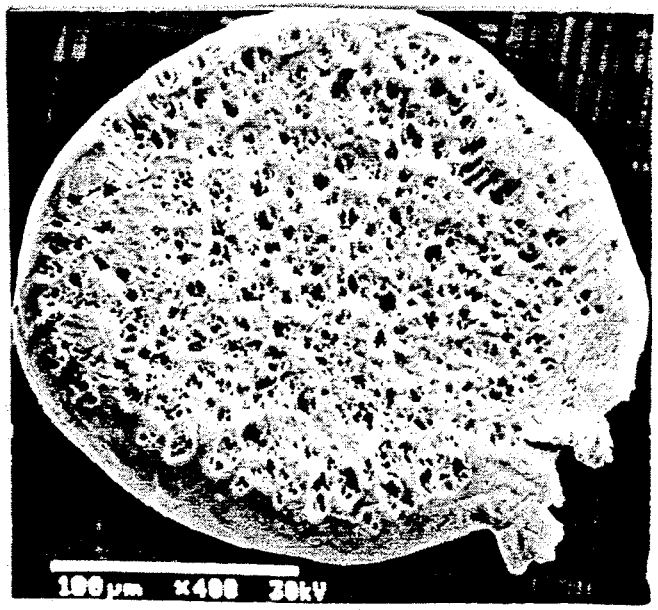

METHOD OF FABRICATING NENDRITIC MATERIALS

This application is a division of application Ser. No. 606,007 filed Oct. 30, 1990, now U.S. Pat. No. 5,137,461, that in turn was a continuation in part of application Ser. No. 415,435 filed Sep. 28, 1989, now abandoned, that in turn was a continuation of application Ser. No. 209,667 filed Jun. 21, 1988, abandoned.

DESCRIPTION

1. Technical Field

The invention relates to electrical connections that can be separated and then, when desired, be reconnected. The invention particularly relates to contacts for high current miniaturized applications, such as semiconductor integrated circuit chips, circuit board and cable interconnections.

2. Background of the Invention

As electrical equipment becomes more densely packed, the interconnections, as a result of the packing, become smaller yet the density of the packing also operates in some cases to increase the electrical current each must carry. It is further becoming increasingly desirable to be able to separate and reconnect such connections for repair and subassembly replacement purposes, simultaneously and reliably re-establishing each member of a large array of such contacts as the subassembly is replaced.

As the art has developed, an appreciation has grown that a connection with members that can interdigitate from each side of the contact would be useful for increasing the number of contacts which can be placed in an array of a given physical size, retention of registration of the connection parts and current carrying capacity.

DESCRIPTION OF THE PRIOR ART

In U.S. Pat. Nos. 2,461,980 and 3,725,844 such interdigitated connection structures are shown wherein the contact members are made up of filament groups similar to a brush.

In U.S. Pat. No. 3,526,867 a description is provided of an interdigitated connector with interlocking properties to retain the parts.

As the art has further advanced, advantages are being appreciated in the use of connections involving interdigitating high aspect ratio projections. The connections are quite rugged and may be used between cables, boards, cards and chips. They provide high current with low resistance while using reduced area. The presence of contamination problems is reduced with this type of connection by the wiping action of the interdigitating members on each other, sweeping the contamination, such as dust, away.

In German Patent DE 2816328 the interdigitated connector is made of a material having dendritic type protrusions that intermesh from each side of the contact.

One approach in the art to reduce the lateral stress damage involved the use of a liquid metal as described in U.S. Pat. No. 4,254,431. Liquid metals, however, were in turn susceptible to formation of a tarnish or corrosion layer on the surface and palladium dendrites embedded in a gallium-indium alloy coating is advanced in IBM Technical Disclosure Bulletin 22 7 1979, page 2706, as a solution.

As the art still further progressed, it became apparent that palladium dendrites made good contacts and that the wiping action of the dendrites that occurred on connecting was useful. It was further considered desirable to reduce the lateral stress problem by strengthening the dendrites. One technique of producing palladium dendrites involved electrodeposition or plating in a dilute electrolyte. This is described in EPO 0054695. Palladium dendrites are described as being strengthened in IBM Technical Disclosure Bulletin 23 8 1981, page 3631, by plating tin thereon and reflowing to reform the tin around the base of the dendrite for reinforcement. Palladium dendrites are further described in IBM Technical Disclosure Bulletin 24, No. 1A, 1981, page 2, where cucumber shaped dendrites are formed by plating in an agitated bath with dendrite base reinforcement with an overplate. The overplating of Pd by using two different subsequent baths is described in EPO 0020020.

There remains, however, a problem in the art that as the aspect ratio of the interdigitating member becomes greater and wider ranges of applications of the technology become desirable, closer control of the effect of the lateral stresses, an increased selection of available materials and more flexible and reliable processing are needed.

SUMMARY OF THE INVENTION

The connection is made up of an essentially planar area of conductive material on which there is provided a plurality of essentially vertical interdigitating members protruding from the surface of and integrally fastened to the planar conductive material, each having a vertical to horizontal aspect ratio that is greater than 1 and the combination of the planar portion and the interdigitating members being provided with a means for accommodating displacement stresses internal to the contact that are lateral with respect to the planar direction.

The means of accommodating the stresses includes the providing of strengthening and shock absorbing coating materials on the interdigitating members and to a selected level at the base thereof. Controlled morphology dendrites are formed and coated by electroplating, including pulse electroplating, physical deposition and chemical vapor deposition. A rigid connection is provided through the use of a surrounding immobilizing encapsulant.

BRIEF DESCRIPTION OF THE DRAWINGS

FIG. 11 is a schematic illustration of an interdigitated contact member where lateral displacement stress accommodation is provided internal to the contact by a plated coating.

FIGS. 12 and 13 are scanning electron micrographs, without tilt, of the contact of FIG. 11 using dendritic material at approximately 200× magnification, at 0 times and 50 times separation and reconnection, respectively.

FIG. 18 is a scanning electron micrograph at 1500× magnification, tilted at an angle of 60 degrees, of palladium dendrites formed by constant current plating.

FIG. 19 is a scanning electron micrograph at 1500× magnification, tilted at an angle of 60 degrees, of palladium dendrites formed by pulse current plating.

FIG. 20 is a schematic section of a solder ball interdigitated contact with rigidity encapsulation.

FIG. 21 is a scanning electron micrograph at 400× magnification of the solder ball of a solder ball interdigitated contact after being pressed together and subsequently separated.

DESCRIPTION OF THE INVENTION

Figure 1:
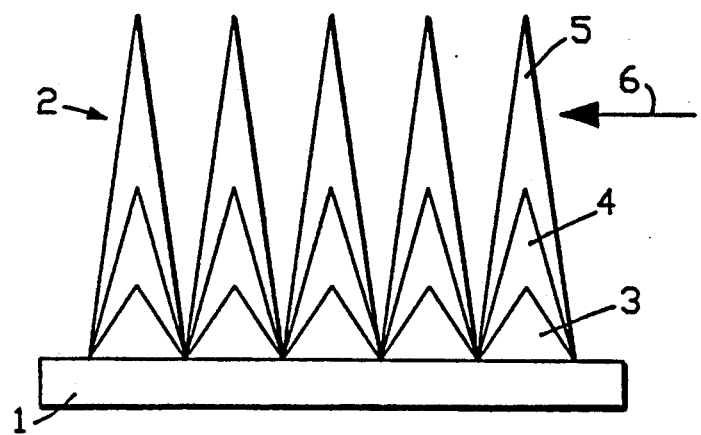
FIG. 1 is a schematic illustration of the different aspect ratios of and stress on interdigitating members.

In accordance with the invention, the connection of the invention is made up of an essentially planar area of conductive material on which there is provided a plurality of essentially vertical interdigitating members that protrude from the surface and are integrally fastened to the surface of the planar conductive material. Each of the interdigitating members has an aspect ratio greater than 1 and in accordance with the invention provision is made for accommodating horizontal internal to the contact displacement stresses on the interdigitating members. The aspect ratio and the stresses are graphically illustrated in connection with FIG. 1 wherein, on the planar conductive material 1, a plurality of interdigitating members 2 are shown. Each of the interdigitating members is schematically illustrated with increasing aspect ratios. Element 3 indicates an aspect ratio of 1, element 4 indicates an aspect ratio of 2 and element 5 indicates an aspect ratio of 4. The horizontal stresses that occur, due to such matters as misalignment and other interdigitating members entering the spaces between them, are shown symbolically as the arrow 6. It will be apparent that as the aspect ratio becomes larger the potential for lateral stress to damage the interdigitating members increases.

Figure 2:
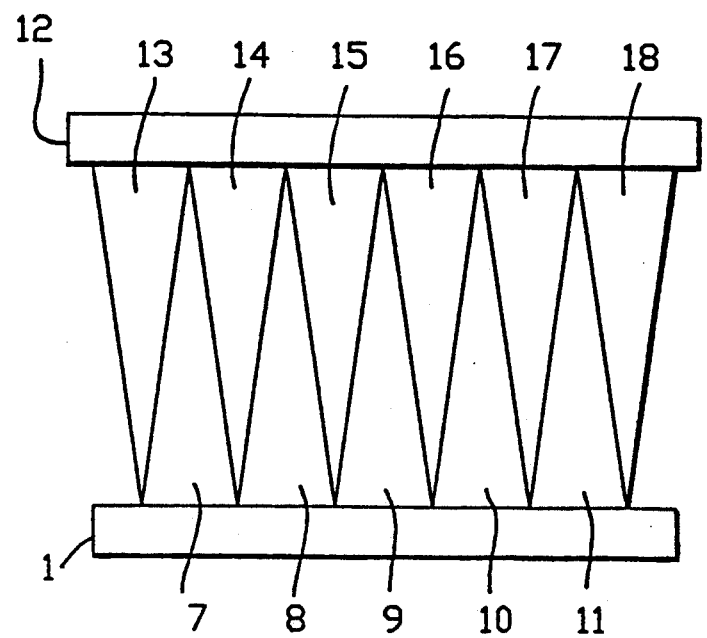
FIG. 2 is a schematic illustration of a connector wherein the joining parts are conformal.

Referring next to FIG. 2, a schematic illustration is provided of joining contacts in which one contact on the planar conductive member 1 has interdigitating members 7, 8, 9, 10 and 11, and an opposite conductive member 12 has interdigitating members 13, 14, 15, 16, 17 and 18. Such a contact accommodates the potential for horizontal stress because when the contact is taken apart and put together the contact has a place for each part of the opposite member so that there is stress with minimal damage on the individual interdigitating members, maximizing plastic deformation of the surfaces. This ideal circumstance cannot, of course, be realized in practice. Further, it would not provide the microscopic spots of plastic deformation nor the open areas into which foreign material or contaminants can be driven as are necessary for reliable establishment of electrical contact between the interdigitating members 13. It is one objective of this invention to dispose the interdigitating members such that a suitable level of lateral stress is developed upon mating, another objective of this invention is to provide sufficient space between the interdigitating members to accommodate any adventitious foreign material or contaminants which may be present, and yet another objective of this invention is to provide means to accommodate the required levels of lateral stress without damage to the interdigitating members.

In accordance with the invention, there are two general types of material that can be produced sufficiently economically, with high aspect ratios and can be placed in the confined locations for contact purposes. They are known as hillock and dendritic material as is illustrated in scanning electron micrographs FIG. 3 and FIG. 4, respectively. The materials can be positioned on substrates to very fine dimensions. Such materials, however, when used as the interdigitating members are subject to damage due to the horizontal stresses described in connection with FIG. 1, produced mostly by the random nature of the interdigitating members and misalignment as the contacts are placed together.

The invention is practiced through the selective and combinatorial use of electroplating, including pulse electroplating, physical deposition such as sputtering including the use of multiple guns and chemical vapor deposition type processes.

A wide range of materials may be employed, including as examples palladium, platinum, rhodium, iridium, ruthenium, osmium, tungsten and copper. Hillock and dendritic materials may be formed in the best mode by low ion concentration, high current density type electroplating and pulse type electroplating, and by hydrogen reduction of a gaseous compound of a metal. In the low ion concentration, high current density type of plating, the concentration of metal ions in the plating solution is maintained below normal, as for example for Pd a 20–50 millimolar solution vs. a 100 millimolar normal solution, while the current for the electroplating is maintained at higher than normal current density, again in a Pd example 100 mA/sq.cm. vs. 10 mA/sq.cm. normal. In pulse electroplating, the current is interrupted at a low frequency rate during the deposition.

Figure 3:
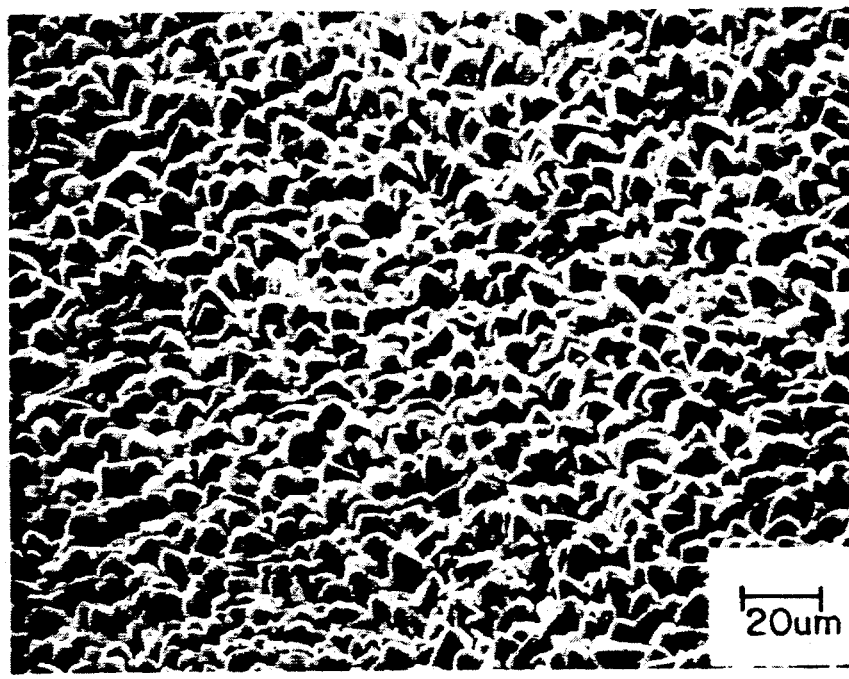
FIG. 3 is a tilted view of a scanning electron micrograph of hillock type interdigitating material.
Figure 4:
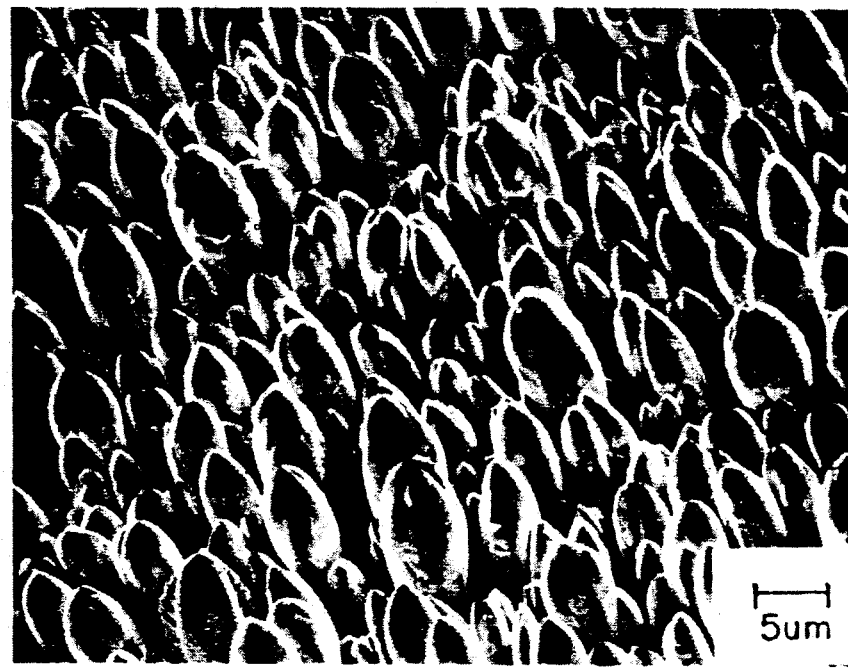
FIG. 4 is a tilted view of a scanning electron micrograph of dendritic type interdigitating material.

The materials of FIGS. 3 and 4 may, as a gaseous metal reduction example, be formed by the hydrogen reduction of a volatile halide compound of the metal to be employed, taking for an example tungsten hexafluoride. Since tungsten hexafluoride is a liquid with a high vapor pressure, its delivery to a reaction chamber is readily achievable as a gas. Purified hydrogen may be used as a carrier gas and as a reactant. Reaction generally takes place from 400 to 650 degrees Centigrade. The hillock material is made with the same procedures as a dendritic material but for a shorter period time. The hillock material 20 is generally used for applications wherein the specifications are not as rigorous.

The processes used in formation of the hillock and dendritic materials are then combined with processing for coating and strengthening.

Figure 5:
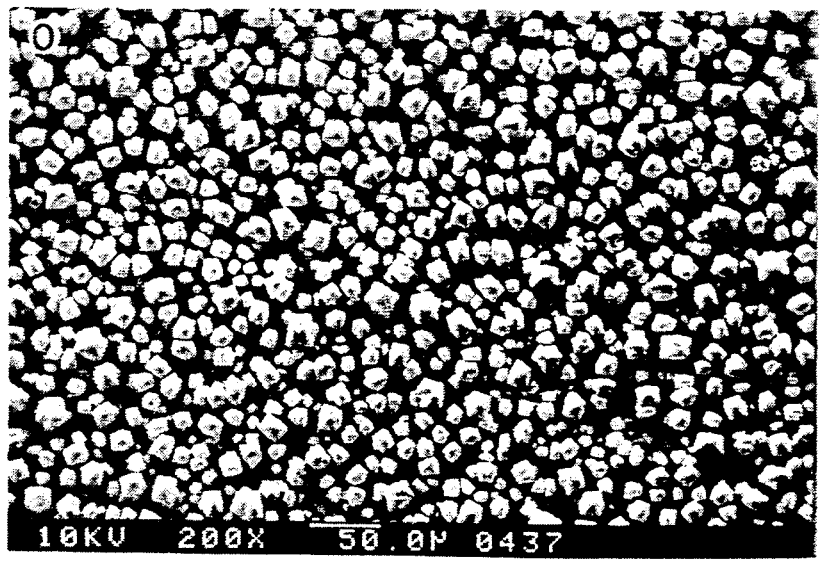
FIGS. 5, 6 and 7 are scanning electron micrographs, without tilt, showing progressive damage due to misalignment of contacts of dendritic interdigitating material for 0, 3 and 50 separation and reconnection times, respectively.
Figure 6:
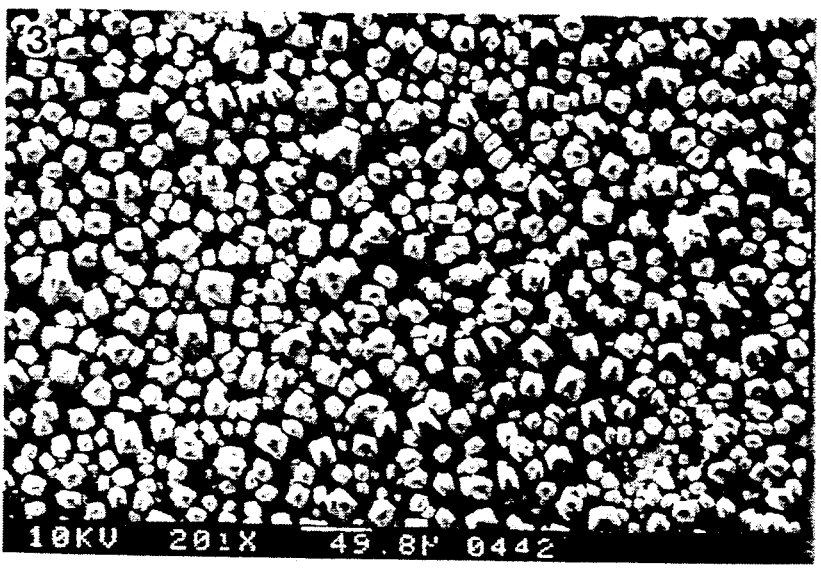
Figure 7:
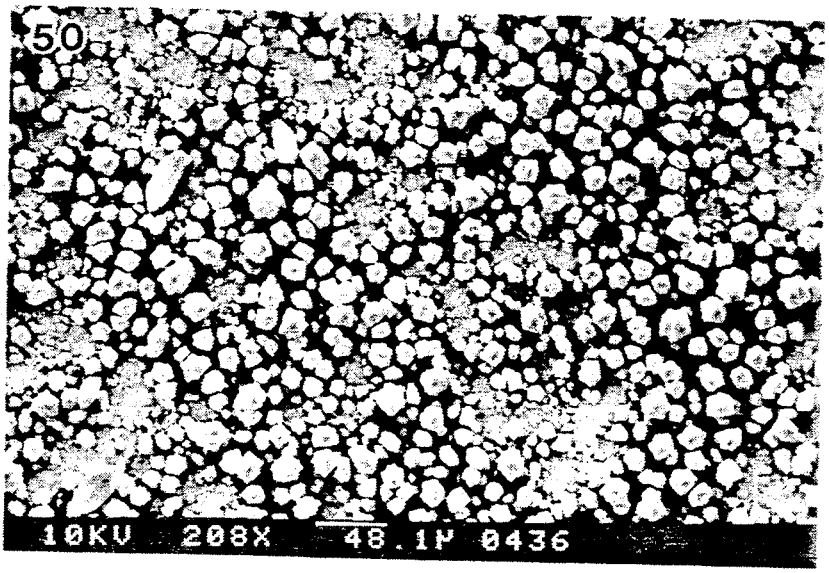

In FIGS. 5, 6 and 7, which are scanning electron micrographs of dendritic material as shown in FIG. 4, made of tungsten, at approximately 200 times magnification, the effect of lateral stress damage is illustrated.

In FIG. 5, the starting material has not been pressed together in the form of a contact and no damage is seen. In FIG. 6, however, the contact has been pressed together three times and in the lower right-hand corner some measure of damage is beginning to become apparent.

Referring next to FIG. 7, after 50 times of insertion, there are areas of damage scattered throughout the entire contact.

In accordance with the invention, an accommodation is provided to handle the stress shown in FIG. 1 that produces the damage in FIG. 7. That accommodation may take several forms. The ideal form would be to have the contact be of the nature shown schematically in FIG. 2 wherein the two sides of the contact would precisely mate. Another approach would be to provide some strengthening for the interdigitating members. Still another approach would be to provide some physical accommodating soft coating for the interdigitating members.

Figure 8:
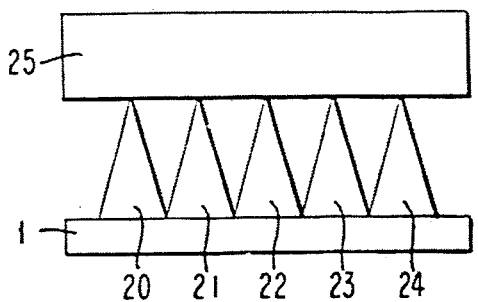
FIG. 8 is a schematic illustration of an intermediate step in forming a conformal contact as shown in FIG. 2.

Referring to FIG. 8, there is provided a schematic illustration of the fabrication of the preferred embodiment wherein the planar area of conductive material 1 has an illustrative number of interdigitating members 20, 21, 22, 23 and 24 integrally attached to it and these are being pressed into a conformal metal material 25 that when the pressing is complete will have changed its shape to form a series of corresponding locations for the interdigitating members 20 through 24. This may be done, for example, by providing as the interdigitating members of palladium, tungsten or copper dendrites or the like, of about 15 mils in height and about 1-5 mils thick, grown on the conductive material 1 and having the conformal pad 25 be soft or deformable, such as of lead tin eutectic solder or pure gold, or the like. Dendrites 10 to 40 micrometers in height and about 1-5 micrometers thick are also satisfactory. The conformal pad 25 may, for example, be a solder ball contact on the surface of an integrated circuit chip. The joined contact may, if desired, be subjected to a fusion thermal cycle, however, the contact is mechanically very stable without any solder reflow.

Figure 9:
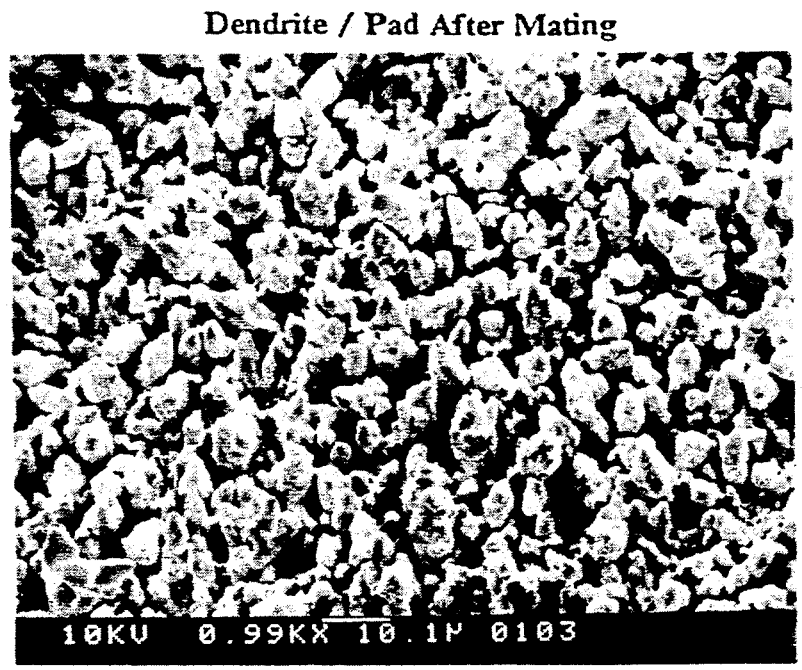
FIGS. 9 and 10 are scanning electron micrographs, without tilt, showing the dendritic interdigitating member and the conformal pad member, respectively, after joining and subsequent separation.
Figure 10:
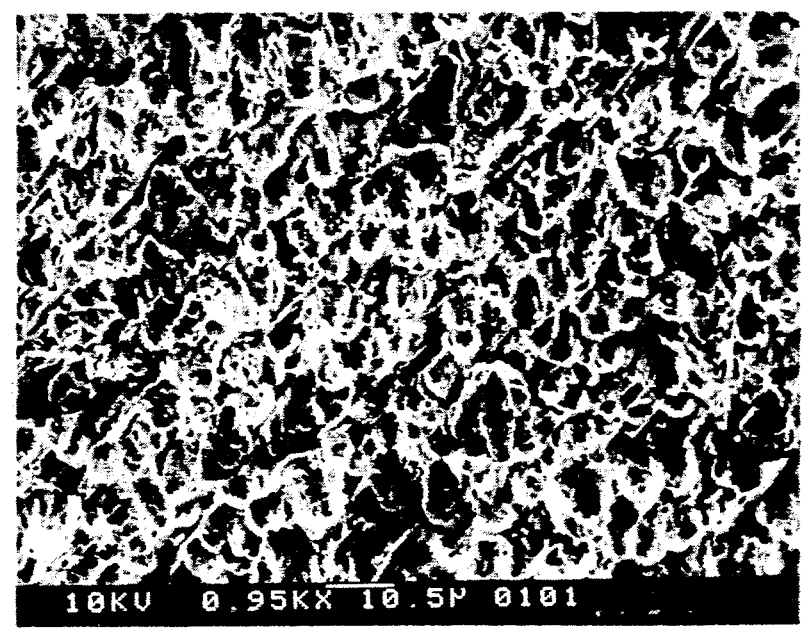

Referring next to FIGS. 9 and 10, scanning electron micrographs with about 100 magnification of the interdigitating members and pad after joining and subsequent separation are shown. In FIG. 9, the interdigitating members, illustrated symbolically in FIG. 8 as 20-24, are palladium dendrites. In FIG. 10, the lead tin eutectic solder pad 25 is shown. It will be apparent that the dendrites have penetrated the pad 25 and that the soft or deformable eutectic solder pad conforms to the shape of the dendrites and provides a strong mechanical bond without horizontal stresses that would provide dendrite breakage.

In FIG. 11 a schematic illustration is shown wherein the interdigitating members are strengthened with a coating in order to provide an accommodation for the horizontal stresses.

In coating, the dendritic or hillock structures act as templates in subsequent depositions for the purpose of improving strength and/or contact performance. There are several processes that can be used. In an illustrative example, palladium can be electroplated on the surface of dendrite interdigitating members with the palladium strengthening the interdigitating member to which it is applied. Gold, where the gold ranges in hardness from the term used in the art of "dead soft" gold, which is the purest form and which is easily deformable, to "hard" which is produced by additives to the bath such as for example nickel or cobalt containing compounds may then be electroplated over the surface of the palladium to improve the stability of the electrical contact resistance between the two conducting surfaces when the dendrites are interdigitated.

In another illustrative example, DC, RF or Ion Beam type sputtering processes can be used to provide strengthening or soft shock absorbing layers. The layers can be applied sequentially as for example a copper strengthening layer of approximately 5 micrometer thickness with an appropriate barrier if needed, followed by a soft gold deforming and shock absorbing layer of approximately 0.1 to 2 micrometers in thickness.

Referring to FIG. 11, on the planar conductor member 30, the interdigitating members 31 are of tungsten and are provided with an adhesion coating of chromium approximately 500 Angstroms thick 32, covered by a strengthening coating of copper about 5 microns thick 33. The adhesion coating is provided by plating and the copper coating is provided by sputtering.

Alternatively, the strengthening coating 33 may be made of electroplated "hard" gold which is preferably produced by additives placed in the electroplating bath which codeposits compounds with the gold that in turn results in a finer grain size. A typical additive is Boric Acid which results in a codeposit of boron. Other additives are compounds of nickel, cobalt and chromium. Strengthening coatings are not necessarily of corrosion protection material and are typically 1 to 5 micrometers thick.

Referring next to FIGS. 12 and 13, scanning electron micrographs of the copper strengthened tungsten dendritic structure described in connection with FIG. 11 are provided where, in FIG. 12, at about 200 times magnification, the structure is shown as manufactured and in FIG. 13, at approximately the same magnification, after about 50 times of mating with another contact at a slight off angle of registration. The strengthening coating 33 of FIG. 11, as may be seen from FIG. 13, is adequate to prevent breakage of the type shown in FIG. 7.

Figure 14:
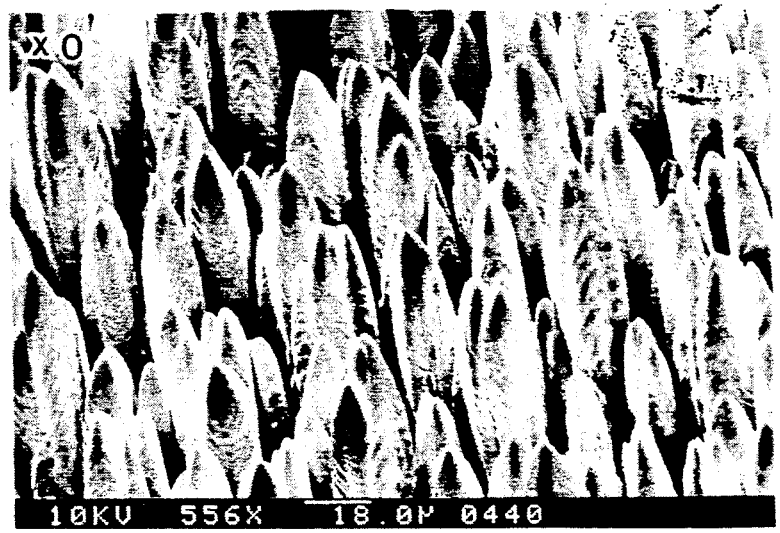
FIGS. 14 and 15 are tilted view scanning electron micrographs of the structures of FIGS. 12 and 13 at approximately 500× magnification.
Figure 15:
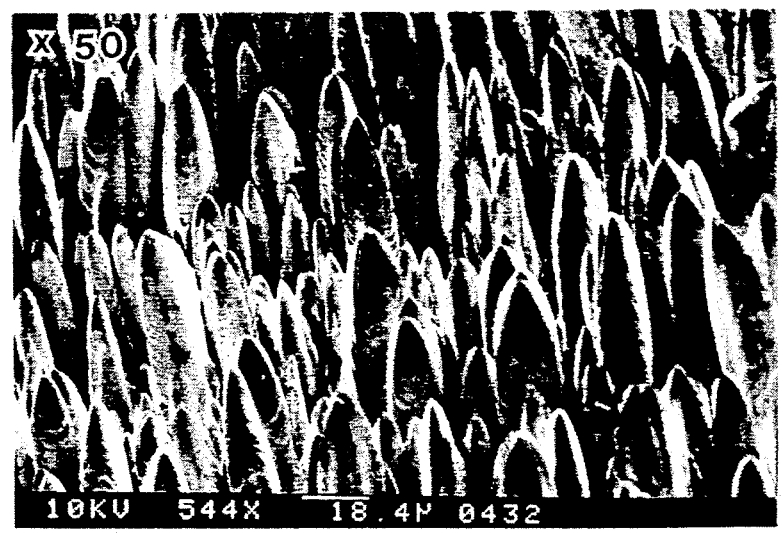

The protection from damage through strengthening becomes even more apparent in connection with FIGS. 14 and 15 wherein, at around 500 times magnification, in FIG. 14 the dendrites are shown as manufactured whereas in FIG. 15, at the end of 50 times of mating, there is no indication of damage.

Figure 16:
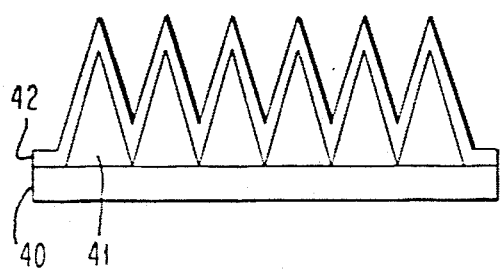
FIG. 16 is a schematic illustration of lateral stress accommodation, employing a soft deformable and shock absorbing coating.
Figure 17:
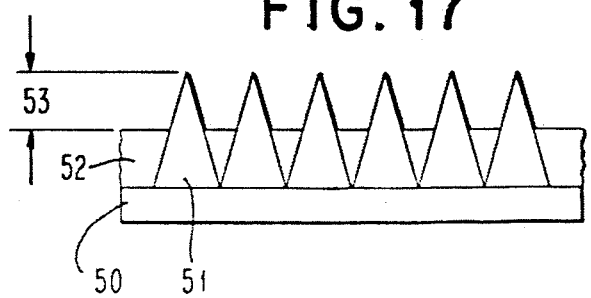
FIG. 17 is a schematic illustration of lateral stress accommodation, employing an interdigitating member reinforcing material.

In FIGS. 16 and 17, two additional approaches to the accommodation of lateral stresses are schematically illustrated.

In connection with FIG. 16, the accommodation is accomplished by providing a coating that serves as a displacement shock absorber to lateral stresses.

In FIG. 16, on the planar material 40, the interdigitating members 41 are positioned and over them there is placed a coating 42 that may be a soft gold base provided by a dry process, such as evaporation, or by a wet process, such as electroplating, the gold being sufficiently soft that in the interdigitation with another contact the gold deforms and thereby absorbs the shock to the hardened dendritic materials so as to relieve any lateral stress.

In providing the coating 42 of soft gold, or "dead soft" gold as the term has developed in the art, the gold is in a very pure state with large grains. This state can readily be achieved by the electroplating of 24K gold. The coating is approximately 0.1 to 2 micrometers thick.

In FIG. 17, the lateral, internal to the contact, stress is accommodated through reinforcement of the interdigitating member 51 with a process differentiable material 52 only at a selected depth around the base of the interdigitating member 51 on the planar member 50. Such a process differentiable material for the element 52 could be polymer. This type of reinforcement is sensitive to the fact that there is a large mechanical advantage tending to prevent good contacting if the ends of the mating contact interdigitating members are prevented from full insertion by the element 52. In the invention, a process differentiable material, such as a polymer, subsequent to application, is removed from both the surfaces of the interdigitating members, and, to a selected contact insertion clearance depth 53. The process differentiability of the material 52, when subjected to a dry isotropic etching process such as reactive ion etching or plasma etching, is fully removed from the interdigitating member 51 surfaces, with the process essentially stopping at the member 51 surface since the member 51 material responds differently to the etching process. The etching can continue vertically on element 52 until the selected level for dimension 53 is reached.

For perspective, the interdigitating member base reinforcement of the invention may be contrasted with an interdigitating member base reinforcement technique in the art described in IBM Technical Disclosure Bulletin 23 8 (1981) page 3631, wherein Sn is plated on dendrites and reflowed to surround and reinforce the base. With such a structure in the absence of the process differentiable aspect of the reinforcing material of the invention, control of depth and availability of insulating materials as the reinforcing material are not achievable.

It has been found that for interdigitating connectors, dendrites that have a morphology with an elongated and cylindrical shape, with sharply rounded points, with minimal branching, are better. Dendrites with such a morphology exhibit less deformation and improper joining over multiple insertions.

Dendrites exhibiting the desired morphology can be fabricated with a pulsed plating technique. The permitted pulse frequency range is of the order of 50 to 450 per second. At lower frequencies, the plating is not significantly different from DC type plating and at higher frequencies capacitance effects interfere. The pulse parameters affect the kinetics of the electrodeposition process. Growth of existing crystals may be selectively favored in dendrite growth over generation of fresh nuclei, leading to preferential growth of the taller dendrites and of the dendrite tip rather than branches. Hence, pulse plating may be used to improve the dendrite morphology with respect to that obtainable with constant current plating.

In the pulse electrodeposition of the invention for an example palladium dendrite deposition, the peak current density is 200–1100 milliamperes per square centimeter. The duty cycle is at least 5%. There is a pulse repetition rate of 50 to 417 per second. The pH is from 8.4 to 9.6. The Pd concentration in the bath is 10–150 millimolar using palladium tetrammine chloride. The ammonium chloride concentration is approximately 5 molar, which is near saturation at 20 degrees C.

The advantages of this palladium dendrite growth process can be seen in a comparison of FIGS. 18 and 19. In FIG. 18 there is a scanning electron micrograph of palladium dendrites grown in a standard constant current (100 mA/cm$^2$) process to a height of 10–30 $\mu$m. In FIG. 19, in the scanning electron micrograph of palladium dendrites grown by pulse plating, the dendrites have a more uniform (20–25 $\mu$m) height, rounded uniform points and less branching.

The dendrites in FIG. 19 were grown as follows. In a first step, a non porous layer of Pd was plated on a Ni substrate from a 150 millimolar palladium tetrammine chloride bath (9.0 pH) at a constant current density of 5 mA/cm$^2$ for 30 minutes. A mild solution agitation was maintained during the plating operation. In a second step, the palladium dendrites are grown by pulse plating on the first step palladium layer under the conditions of 800 mA/cm$^2$ peak current, 1 mS pulse on time, 9 mS pulse off time, 10% duty cycle for 40 minutes in a solution of 15 millimolar palladium ammine chloride pH 9.0 with ammonium chloride at approximately 5.0 molar. Intermittent ultrasonic agitation was employed to dislodge hydrogen gas bubbles.

A preferable set of pulse plating conditions for palladium dendrite pulse plating include a peak current density of 500–1000 mA/sq.cm., a duty cycle of 10 to 20%, a pulse repetition rate of 200–417 per second, a bath pH of 9.0 to 9.5 with a Pd concentration of 10–20 millimolar and an ammonium chloride concentration of greater than 5 molar. This preferable set of conditions grows cylindrical pointed dendrites 30–40 micrometers high.

When the contact of the invention is placed in service, a force is usually applied in the form of a clamp to keep the two joining portions together although frequently in electronic equipment such items as the covering can for an integrated circuit chip may perform some of the functions of retaining the contacts in position.

A very rigid contact structure that may employ but does not require solder reflow is provided by pressure insertion of an interdigitating contact member into a conformable soft contact member of the device and surrounding the contact location with an immobilizing material, such as epoxy, which is non-conductive or is with insulation properties.

Referring to FIG. 20, in a schematic illustration of the contact there is, on the device substrate 60, a conformable contact member 61, such as a solder ball standard in the art. The member 61 is a quantity of solder that is formed by surface tension when liquid, into ball like shape with a curved upper surface. The solder ball 61 conforms to and mates with the dotted interdigitating members 62, such as dendrites grown on the external contact member 63. The contact location is then surrounded and encapsulated with an immobolizing material 64, such as epoxy, which may be disposed over most of the external contact member 63 by extending the immobilizing material 64 at 65.

The detail of the contact is shown in FIG. 21. FIG. 21 is a scanning electron micrograph at 400× magnification of the solder ball 61 after the interdigitating member 62 bearing contact 63 has been pried apart. The interdigitating members 62 were of hillock copper that had been pressed into the solder ball 61 with an about 0.05 pound per solder ball insertion force. After insertion, the contact thickness of the element 61 of FIG. 20 was about 5 mils and the resistance was about 0.3 ohms.

The contact is particularly useful in applications where a solder reflow temperature excursion could be detrimental and in temporary type connections, such as intermediate testing operations.

What has been described is a connection made up of a planar area of a conductive material having a plurality of interdigitating members protruding from the surface with a means for accommodating lateral stresses to the interdigitating members that occur from misalignment and from the interdigitating members forcing each other apart.

Having thus described our invention that we claim as new and desired to secure by Letters Patent is:

1. The method on forming dendritic material comprising in combination the steps of:

plating a layer of palladium on a nickel substrate in a 150 millimolar palladium tetra ammine chloride bath at a pH of 9.0 at constant current for 30 minutes with mild solution agitation, and thereafter, pulse plating palladium at 800 mA per square cm peak current, at a 10% duty cycle of 1 millisecond pulse on time 9 millisecond pulse off time, in a solution of 15 millimolar palladium ammine chloride at a pH of 9.0 with an ammonium chloride concentration of approximately 5.0 molar for 40 minutes with intermittent ultrasonic agitation to deposit dendritic palladium.

2. The method of claim 1 including the additional step of plating over said dendritic palladium a coating of a metal taken from the group consisting of gold, palladium and alloys thereof.

3. The method of claim 2 wherein gold is used as said coating and during said plating of said coating a metal taken from the group consisting of boron, nickel, chromium and cobalt is included.

4. The method of claim 3 wherein said included metal is boron, and boric acid is added to the plating bath used to carry out said additional step of plating.

* * * * *

UNITED STATES PATENT AND TRADEMARK OFFICE
CERTIFICATE OF CORRECTION

PATENT NO. : 5,185,073

DATED : Feb. 9, 1993

INVENTOR(S) : Bindra et al.

It is certified that error appears in the above-identified patent and that said Letters Patent is hereby corrected as shown below:

On the title page: Item [54] and Column 1, line 1,
In the Title - "NENDRITIC" should read --DENDRITIC--.

Item [75]
Inventors: should read -

Perminder S. Bindra

David Noel Light

Jaynal Abedin Molla

George J. Saxenmeyer

Signed and Sealed this

Seventh Day of December, 1993

Attest:

BRUCE LEHMAN

*Attesting Officer*   *Commissioner of Patents and Trademarks*